United States Patent [19]

Yagi et al.

[11] 4,032,956
[45] June 28, 1977

[54] TRANSISTOR CIRCUIT

[75] Inventors: Hajime Yagi, Tokyo; Tadaharu Tsuyuki, Isehara, both of Japan

[73] Assignee: Sony Corporation, Tokyo, Japan

[22] Filed: Apr. 17, 1975

[21] Appl. No.: 569,309

Related U.S. Application Data

[63] Continuation-in-part of Ser. No. 427,647, Dec. 26, 1973, abandoned.

[30] Foreign Application Priority Data

Dec. 29, 1972 Japan .................................. 48-551
May 8, 1974 Japan ............................. 49-50871
May 9, 1974 Japan ............................. 49-51563

[52] U.S. Cl. ................................. 357/37; 357/23; 357/34; 357/39; 357/40; 357/88; 357/89; 357/90
[51] Int. Cl.² .................. H01L 29/00; H01L 29/72; H01L 29/747; H01L 27/02
[58] Field of Search .................. 357/40, 34, 37, 39, 357/23, 88, 89, 90

[56] References Cited

UNITED STATES PATENTS

| 2,822,310 | 2/1958 | Stieltjes et al. ...................... 357/40 |
| 3,204,160 | 8/1965 | Sah ..................................... 357/40 |
| 3,641,404 | 2/1972 | Per ..................................... 357/40 |
| 3,699,406 | 10/1972 | Mapother et al. ................... 357/40 |

FOREIGN PATENTS OR APPLICATIONS 906,036   9/1962   United Kingdom ................. 357/40

*Primary Examiner*—Edward J. Wojciechowicz
*Attorney, Agent, or Firm*—Hill, Gross, Simpson, Van Santen, Steadman, Chiara & Simpson

[57] ABSTRACT

A transistor circuit is disclosed in which a region with opposite conductivity type to that of an emitter region or a MOS type structure is disposed adjacent to the emitter region within the diffusion length from an emitter-base junction. A gain control circuit is constructed by varying the emitter-grounded current amplification factor $h_{FE}$ of a transistor.

10 Claims, 15 Drawing Figures

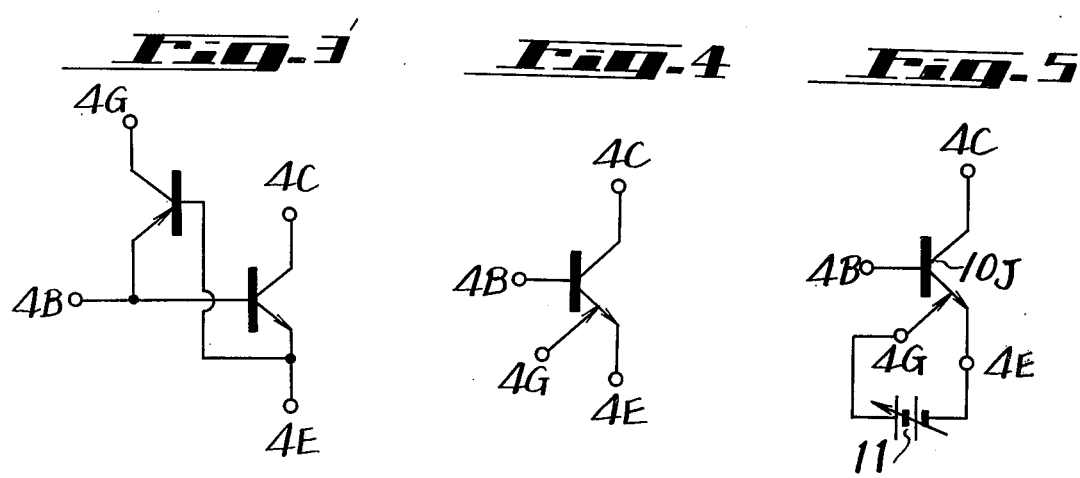
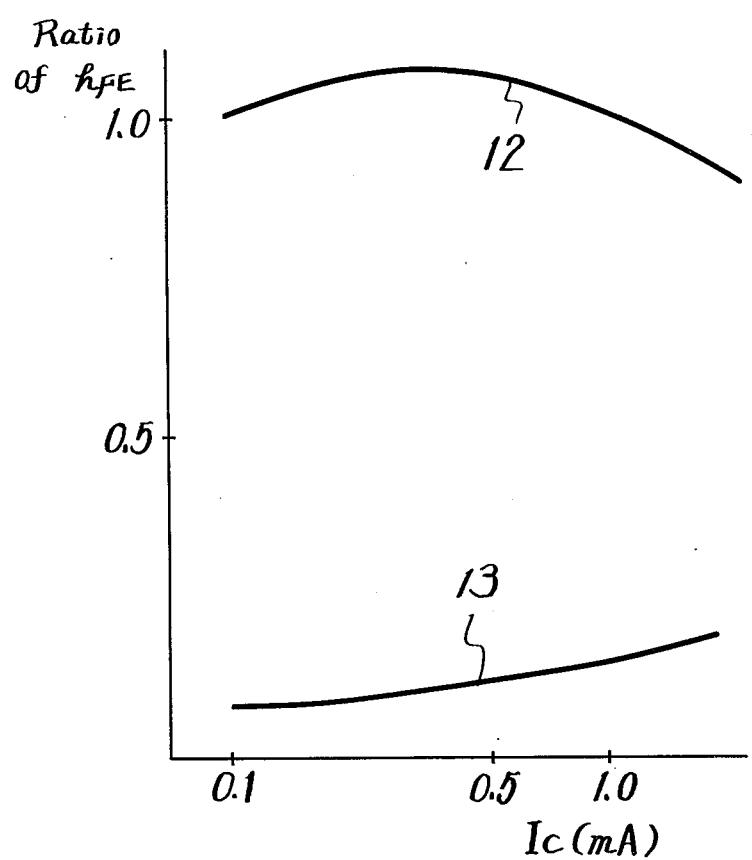

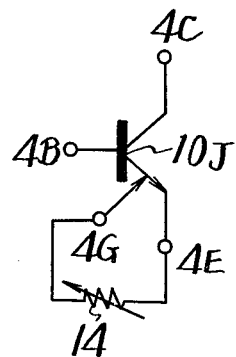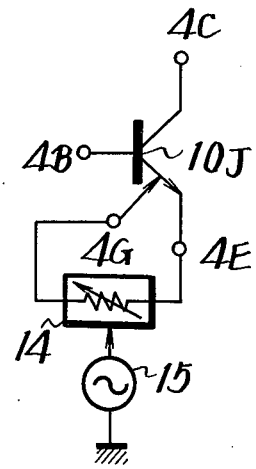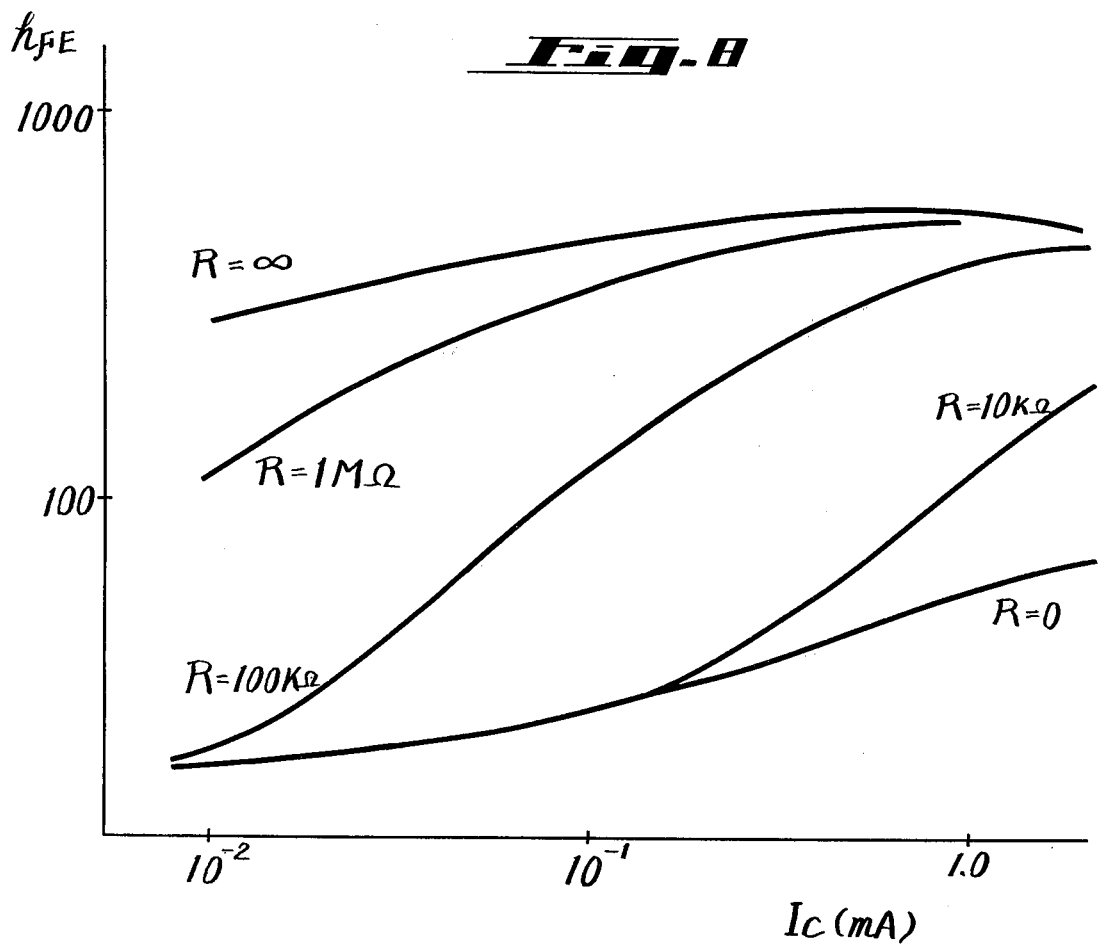

TRANSISTOR CIRCUIT

CROSS REFERENCE TO RELATED APPLICATION

This application is a continuation-in-part of our earlier filed application, Ser. No. 427,647, filed Dec. 26, 1973 now abandoned, having a priority date in Japan of Dec. 29, 1972, and assigned to the same assignee as the present invention.

BACKGROUND OF THE INVENTION

The present invention relates to a transistor circuit, and more particularly to a novel transistor circuit in which its current amplification factor can be controlled easily and freely.

The emitter-grounded current amplification factor $h_{FE}$ as one of parameters for evaluating the characteristics of a transistor is given by the following equation:

$$h_{FE} = \frac{\alpha}{1-\alpha} \quad (1)$$

where $\alpha$ is the base-grounded current amplification factor. The factor $\alpha 0$ is given as follows:

$$\alpha = \alpha * \beta \gamma \quad (2)$$

where $\alpha *$ is the collector amplification factor, $\beta$ is the base transport factor, and $\gamma$ is the emitter injection efficiency. A consideration will now be taken on the emitter injection efficiency $\gamma$ of an NPN-type transistor. The emitter injection efficiency $\gamma$ is given as follows:

$$\gamma = \frac{J_n}{J_n + J_p} = \frac{1}{1 + \frac{J_p}{J_n}} \quad (3)$$

where $J_n$ is the current density according to electrons injected from emitter into base, and $J_p$ is the current density according to holes injected from base into emitter.

In this connection, $j_n$ and $J_p$ are respectively given as follows:

$$J_n = \frac{qD_n n_p}{L_n} \left\{ \exp\left(\frac{qV}{kT}\right) - 1 \right\} \quad (4)$$

$$J_p = \frac{qD_p p_n}{L_p} \left\{ \exp\left(\frac{qV}{kT}\right) - 1 \right\} \quad (5)$$

Therefore, the following equation is obtained.

$$\delta \equiv \frac{J_p}{J_n} = \frac{L_n}{L_p} \cdot \frac{D_p}{D_n} \cdot \frac{p_n}{n_p} \quad (6)$$

where
- $L_n$: diffusion length of minority carrier in base
- $L_p$: diffusion length of minority carrier in emitter
- $D_n$: diffusion constant of minority carrier in base
- $D_p$: diffusion constant of minority carrier in emitter
- $n_p$: concentration of minority carrier in base at its equilibrium
- $p_n$: concentration of minority carrier in emitter at its equilibrium
- $V$: voltage applied to emitter junction
- $k$: Boltzmann's constant
- $T$: temperature If the impurity concentration of emitter is taken as $N_D$ and the impurity concentration of base is taken as $N_A$, $p_n/n_p$ can be replaced by $N_A/N_D$. Further, $L_n$ is limited by the base width W and $L_n = W$ can be satisfied, so that the following equation is given:

$$\delta = \frac{W}{L_p} \cdot \frac{D_p}{D_n} \cdot \frac{N_A}{N_D} \quad (7)$$

The diffusion constants $D_n$ and $D_p$ are the function of the carrier mobility and temperature and regarded as constant.

As will be apparent from the aforesaid equation, in order to enhance $h_{FE}$ of a transitor, it is enough to reduce the value of $\delta$.

Thus, in normal transistors, the emitter impurity concentration $N_D$ is made quite large in order to reduce the value of 67.

However, if the emitter impurity concentration $N_D$ is made quite large such, for example, as more than about $10^{19}$ atoms/cm$^3$, the lattice defect, dislocation and the like occur and hence the perfectness of a crystal can not be attained. In addition, since the emitter impurity concentration is high, the lifetime $\tau_p$ of minority carriers injected thereinto from the base is shortened, and the diffusion length $L_p$ of these minority carriers or holes becomes small according to the following equation:

$$L_p = \sqrt{D_p \tau_p} \quad (8)$$

Accordingly, as is obvious from the equation (7), the value of $\delta$ can not be made so small and the injection efficiency $\gamma$ can not be enhanced more than a certain extent. As a result, the value of $h_{FE}$ can not be enhanced so much.

A special transistor free from such a defect is hereinafter described. This special transitor can be considered as a NPN-type or as a PNP-type, but an NPN-type transistor will be now described, by way of example, with reference to FIGS. 1 and 2.

As shown in FIG. 1, a semiconductor substrate S is provided having a first semiconductor region 1 of N type, a second semiconductor region 2 of P type disposed adjacent to the first region 1, and a third semiconductor region 3 of N⁻type disclosed adjacent to the second region 2. A first PN junction $J_E$ is formed between the first and second regions 1 and 2, and a second PN junction $J_C$ is formed between the second and third regions 2 and 3, respectively.

A potential barrier is formed within the first region 1 opposing to the first junction $J_E$ at a position spaced from the junction $J_E$ by a distance smaller than the diffusion length $L_p$ of minority carriers or holes injected into the first region 1 from the second region 2. In the illustrated embodiment, the impurity concentration of the first region 1 is made quite low such as on the order of $10^{15}$ atoms/cm$^3$, and also an N type region 1a having high impurity concentration on the order of $10^{20}$ atoms/cm$^3$ is formed in the first region 1 to form an L-H junction $J_H$ in the region 1, thus causing a potential barrier to be formed therein.

The impurity concentration of the second region 2 is selected to be on the order of $10^{15}$ to $10^{18}$ atoms/cm$^3$, and that of the third region 3 is selected to be quite low, such as on the order of $10^{15}$ atoms/cm$^3$.

Further, in the third region 3, there is formed a high impurity concentration region 3a of the same conductivity type which is spaced from the second junction $J_c$. The concentration of this region 3a is selected to be on the order of $10^{19}$ atoms/cm³.

A first electrode 4E is deposited on the high impurity concentration region 1a of the first region, in ohmic contact therewith, and similarly a second electrode 4B and a third electrode 4C are deposited on the second region 2 and on the high impurity concentration region 3a of the third region 3, respectively, in ohmic contact therewith. First, second and third terminals E, B and C are respectively led out from the electrodes 4E, 4B and 4C. Further, reference numeral 5 indicates an insulating layer, such as $SiO_2$, formed on the surface of the substrate S.

The above-mentioned element is used as a transistor. In this case, the first, second and third regions 1, 2 and 3 serve as emitter, base and collector regions, respectively, and the emitter junction $J_E$ is applied with a forward bias voltage while the collector junction $J_C$ is applied with a back bias voltage.

With such an arrangement, a hole injected from the base region 2 (the second region) into the emitter region 1 (the first region) is caused to have a long lifetime due to the low impurity concentration of the emitter region 1, superior crystalline property and the like, and hence the diffusion length $L_p$ of the holes in the emitter region 1 becomes long. However, even though the diffusion length $L_p$ is made long, if the injected holes reach the surface of the substrate S and are subjected to surface recombination, in a practical case, the diffusion length $L_p$ can not be made substantially long. With the above described construction, however, since the potential barrier is formed opposing the emitter junction $J_E$ at a distance therefrom smaller than the diffusion length $L_p$, the surface recombination is decreased and the diffusion length can be regarded as sufficiently long.

Thus, there is an effect that the current component $J_p$ of the holes injected into the emitter region 1 from the base region 2 is reduced by the provision of the potential barrier. That is, in the emitter region 1 there occurs the difference of quasi Fermi levels or the built-in field at its L-H junction which acts against the diffusion of minority carriers or holes. Therefore, when the level is sufficiently high, the diffusion current caused by th concentration gradient of the holes and the drift current caused by the built-in-field are cancelled out at the L-H junction $J_H$ to reduce the hole current $J_p$ injected from the base through the emitter region 1 of low impurity concentration. Of the current component passing through the emitter junction $J_E$ the ratio of the electron current reaching the collector region 3 is enhanced due to the above effect. Thus, as is apparent from the equation (3), the value of the emitter injection efficiency $\gamma$ becomes large and $h_{FE}$ is enhanced.

This level difference (the height of the potential barrier) is desired to be larger than 0.1 eV. The value of the built-in-field at the potential barrier is required to be larger than $kT/qL_p$ and in particular is desired to be more than $10^3$ V/cm. In the case when the L-H junction $J_H$ is formed as illustrated, the potential barrier of 0.2 eV can be formed by properly establishing the impurity amount and the gradient of the high impurity concentration region 1a.

In an example of FIG. 2, the high impurity concentration region 1a is provided in the first region 1 to form the potential barrier, and also a P-type additional region 6 is provided in the first region 1 to form a PN-junction $J_S$ in opposition to the first junction $J_E$. Also in this case, the distance between the PN-junction $J_S$ and the junction $J_E$ is selected shorter than the diffusion length $L_p$ of the minority carrier in the first region 1.

With the above-mentioned construction, the holes injected into the first region 1 effectively reach the additional region 6 because of their long diffusion length as mentioned above and are absorbed into the P-type additional region 6. When the additional region 6 is electrically isolated, its potential is raised according to the increase of the holes to forwardly bias the PN-junction $J_S$ formed between the region 6 and the first region 1 up to substantially its rising-up voltage and the holes are injected into the first region 1. For this reason, the concentration of holes in the first region 1 near the additional region 6 is enhanced. Accordingly, the concentration distribution of holes between the junctions $J_E$ and $J_S$ of the first region 1 is uniformed to make its gradient gentle with the result that the diffusion current $J_p$ flowing from the second region 2 to the first region 1 is decreased

SUMMARY OF THE INVENTION

It is a main object of this invention to provide a novel transistor circuit in which an improved transistor is further provided with a specific construction to render the current amplification factor of the transistor controllable easily and freely.

It is another object of this invention to provide a novel transistor circuit suitable for use in a logic circuit.

A transistor circuit of this invention comprises a first semiconductor region of a first conductivity type, a second semiconductor region of a second conductivity type disposed adjacent to the former, and a third semiconductor region of the first conductivity type disposed adjacent to the second region, in which a control semiconductor region is formed in the first semiconductor region at a position opposing to a junction between the first and second regions and spaced therefrom by a distance smaller than the diffusion length of minority carriers in the first region, and first, second and third electrodes are respectively led out from the first, second and third regions while an additional electrode is formed on the control region so as to control its electric condition. Means for supplying a predetermined potential to the first electrode is connected to the additional electrode of the above semiconductor device so that the current amplification factor of the semiconductor element is controlled by the potential supplying means.

The other objects, features and advantages of this invention will be apparent from the following description taken in conjunction with the accompanying drawings.

BRIEF DESCRIPTION OF THE DRAWINGS

FIG. 3' is an equivalent circuit diagram for the specific transistor of FIG. 3;

FIG. 4 is a view of symbolizing the transistor of FIG. 3;

FIG. 5 is a connection diagram showing one example of the circuit of this invention;

FIG. 6 is a graph used for explaining the circuit of FIG. 5;

FIG. 7 is a connection diagram showing another example of the circuit of this invention;

FIG. 8 is a graph used for explaining the circuit of FIG. 7;

FIG. 9 is a connection diagram showing a further example of the circuit of this invention;

DESCRIPTION OF THE PREFERRED EMBODIMENTS

Figure 2:
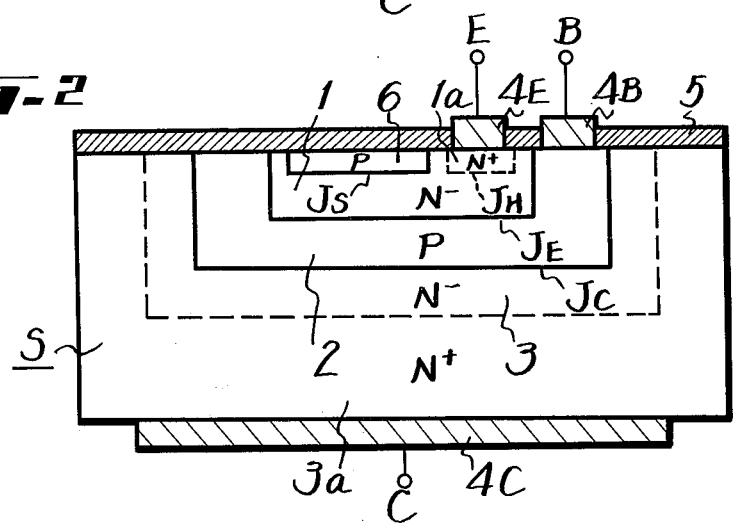
Figure 3:
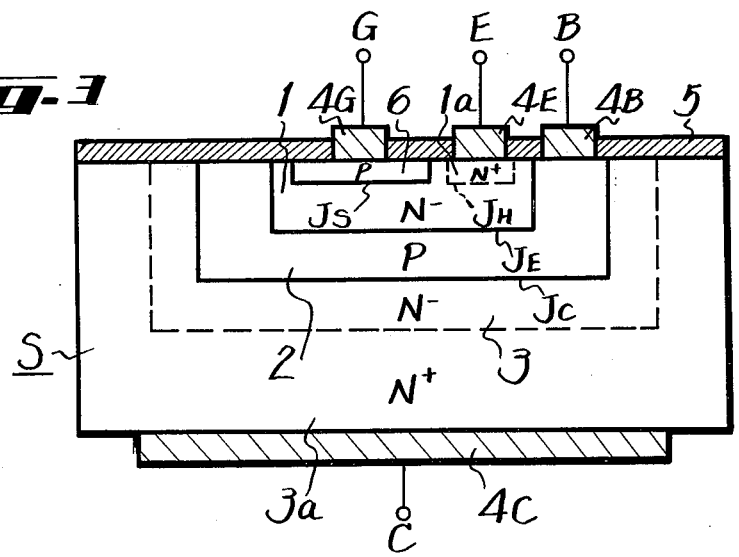
FIG. 3 is a cross-sectional view showing one example of a specific transistor used in a circuit of this invention.

One embodiment of a semiconductor element used in the circuit of this invention is shown in FIG. 3 with elements corresponding to those in FIG. 2 being indicated by the same references.

As shown in FIG. 3, the additional region 6 of the special transistor shown in FIG. 2 is served as a semiconductor control region on which an additional electrode 4G is deposited in ohmic contact therewith, a terminal G being led out therefrom. The above construction is equivalent to an addition of a PNP transistor in which the control region 6 serves as its collector, the first region 1 as its base, and the second region 2 as its emitter as depicted in the equivalent circuit of FIG. 3'. An element of this kind will be hereinafter referred to as a PN-junction type element which is symbolized as in FIG. 4.

In one example of the circuit of this invention, the additional electrode 4G of this PN-junction type element is connected with means for supplying a predetermined potential to the first electrode 4E thereby to control the current amplification factor $h_{FE}$ of the PN-junction type element.

The example of FIG. 5 is a case where a variable DC voltage source 11 is connected between the additional electrode 4G and the emitter electrode 4E in a PN-junction type element 10J. In this case, the voltage value of the voltage source 11 is arranged to be variable from a negative value to a PN-junction forward voltage value $V_{BE}$.

In this circuit, when the voltage value of the voltage source 11 is increased up to the PN-junction forward voltage value $V_{BE}$, the potential of the additional electrode 4G or the control region 6 becomes the same as the base potential in its operative state, so that holes in the control region 6 are reinjected into the emitter region 1 similar to the case where the control region 6 is electrically isolated as in FIG. 2. Consequently, the diffusion current $J_p$ flowing through the base region 2 into the emitter region 1 is decreased, and the value of $H_{FE}$ becomes high. On the contrary, when the voltage value of the voltage source 11 is selected so as to make the potential of the additional electrode 4G lower than the base potential, the control region 6 operates differently from the above case. That is, in this case, the holes injected into the emitter region 1 from the base region 2 is absorbed into the control region 6, so that the concentration of holes at a portion of the emitter region 1 near the junction $J_S$ is greatly lowered. As a result, the concentration gradient of the holes in the emitter region 1 becomes sharp and the diffusion current $J_p$ flowing from the base region 2 into the emitter region 1 becomes large to reduce the value of $h_{FE}$.

FIG. 6 shows the comparison between characteristic curves of the above-mentioned cases in which the abscissa indicates a collector current $I_C$ and the ordinates indicate a ratio of $h_{FE}$. A curve 12 is of the case where the potential of the additional electrode 4G is the same as the base potential, and a curve 13 is of the case where the former is the same as the emitter potential. In this case, the relationship between the collector current $I_C$ and the ratio of $h_{FE}$ is shown with the ratio of $h_{FE}$ being assumed as 1 when the collector current $I_C$ in the case where the potential of the additional electrode 4G is the same as that of the base potential is 0.1 milliampere (mA). As will be apparent from the curves, when the potential of the additional electrode 4G is the same as the emitter potential, $h_{FE}$ is low by about one figure as compared with the case where the former is the same as the base potential. Accordingly, if a potential applied to the additional electrode 4G is varied in a range between where the potential is the same as the base potential and where the potential is the same as the emitter potential, it is possible to vary the value of $h_{FE}$.

FIG. 7 shows another example in which a variable resistor 14 is connected between the additional electrode 4G and first electrode or emitter electrode 4E in the PN-junction type element 10J. In this case, the resistance value of the variable resistor 14 can be taken from zero to infinity.

According to this circuit, in its operative state, the additional electrode 4G is applied with a potential whose value is given by dividing the constant potential difference $V_{BE}$ between base and emitter by the element's internal resistance value between the base and additional electrode 4B and 4G and that of the variable resistor 14. Accordingly, if the resistance value of the variable resistor 11 is varied from infinity to zero, the potential applied to the additional electrode 4G can be varied in a range from a potential the same as the base potential to the potential the same as the emitter potential. Thus, by changing the potential applied to the additional electrode 4G, the value of $h_{FE}$ can be varied similarly as in the case of FIG. 5.

FIG. 8 shows the relationship between collector current $I_C$ and $h_{FE}$ with the resistance value R of the variable resistor 14 being made as the parameter. In this case, the collector-emitter voltage $V_{CE}$ is selected as 3 volts (V).

An example of FIG. 9 is of the case wherein the resistance value of the valuable resistor 14 in FIG. 7 is automatically varied by a control signal from a control signal source 15. That is, the potential of the additional electrode 4G relative to the emitter electrode 4E is varied in response to the control signal thereby to control the $h_{FE}$ of the element 10J. An automatic gain control circuit is thus constructed.

In this invention, it is possible that a plurality of control regions 6 are provided with a common or a plurality of additional electrodes 4G being provided thereon.

Further, as the PN-junction type element used in the circuit of this invention, there can be considered an example such that a second semiconductor control region of N-type is further provided in the P-type control region 6 with the construction of FIG. 3. In this case, if a variable resistor or a variable voltage source is connected between these two control regions and these regions are electrically isolated relative to the emitter region 1, the value of $h_{FE}$ can be varied from the state shown by the curve 12 of FIG. 6 to a state substantially at a middle between the curves 12 and 13. In other words, the value of $h_{FE}$ is high when the resistance value of a variable resistor is large or a forward voltage corresponding to the PN-junction forward voltage is applied between both the control regions, while the same is low when the resistance value of the variable resistor is small or a voltage smaller than the PN-junction forward voltage is applied between both the control regions.

Further, on the semiconductor surface between the inner second control region and the high impurity concentration region 1a of the emitter region 1, there is provided a gate electrode through the insulating layer 5 and thus $h_{FE}$ can be controlled also by changing a voltage applied to the gate electrode.

Figure 10:
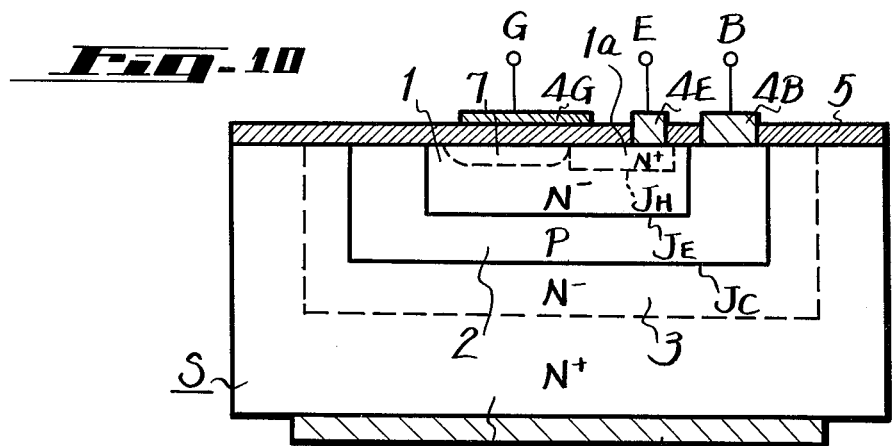
FIG. 10 is a cross-sectional view showing another example of the specific transistor used in the circuit of this invention.
Figure 11:
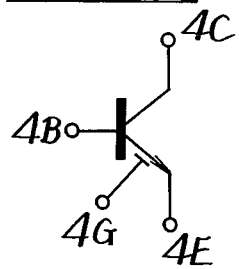
FIG. 11 is a view for symbolizing the transistor of FIG. 10.

FIG. 10 shows a further embodiment of the semiconductor element used in the circuit of this invention. As shown in FIG. 10, the P-type additional region 6 is not provided in the construction of FIG. 2 but the additional electrode 4G is deposited on the insulating layer 5 which covers the semiconductor surface at the portion where the P-type additional region 6 was in the earlier embodiment provided and the terminal G is led out therefrom. An element of this type will be hereinafter referred to as MOS-type element and symbolized as in FIG. 11.

In the above described MOS-type element, the thickness of the emitter region 1 is selected less than the diffusion length $L_p$ of the minority carriers or holes. In the surface of the emitter region 1 at a portion where the voltage $V_{GE}$ of the additional electrode 4G relative to the emitter region 1 is affected, a semiconductor control region 7 is formed at a position opposing the emitter junction $J_E$ and spaced therefrom by a distance smaller than the hole diffusion length as shown by a broken line in FIG. 10.

Figure 1:
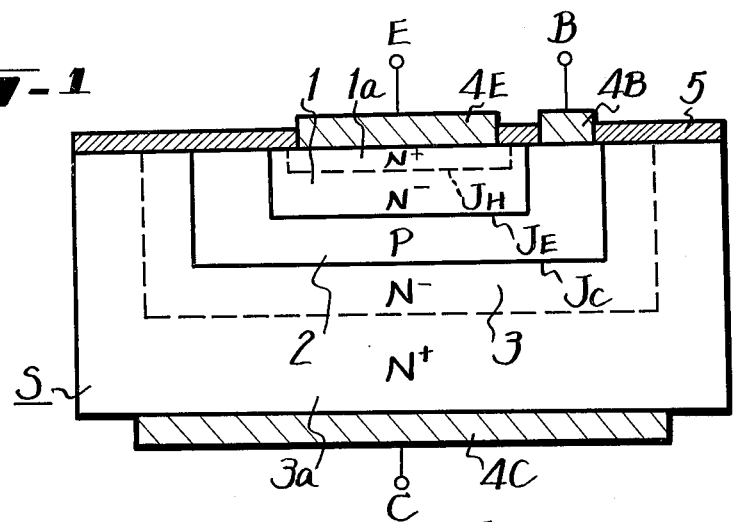
FIGS. 1 and 2 are cross-sectional views each showing one example of specific transistor used for explaining the invention.

In other words, when the additional electrode 4G is applied with a potential positive to the threshold voltage $V_{TH}$, an accumulation layer is formed as the control region 7. When the accumulation 7 is thus formed, similar to the case where the L-H junction $J_H$ is formed as shown in FIG. 1, an electric field is generated between the accumulation layer 7 and the emitter region 1 in a direction against the diffusion of minority carriers or holes from the base region 2 to decrease the diffusion current $J_p$ flowing from the base region 2 to the emitter region 1 with the result that $h_{FE}$ is enhanced. When the additional electrode 4G is applied with a potential negative to the threshold voltage $V_{TH}$, a depletion layer or inversion layer is formed as the control region 7. In this case, the holes are reinjected from the control region 7 into the emitter region 1 to reduce the diffusion current $J_p$ flowing from the base region 2 into the emitter region 1 similar to the case where there is the additional region 6 in an electrically isolated condition, thus causing $h_{FE}$ to be enhanced. Since the holes are recombined in the control region 7 at a position where the potential $V_{GE}$ of the additional electrode 4G relative to the emitter region 1 is equal to the threshold voltage $V_{TH}$ or at its vicinity, $h_{FE}$ is lowered as shown in FIG. 12.

Figure 12:
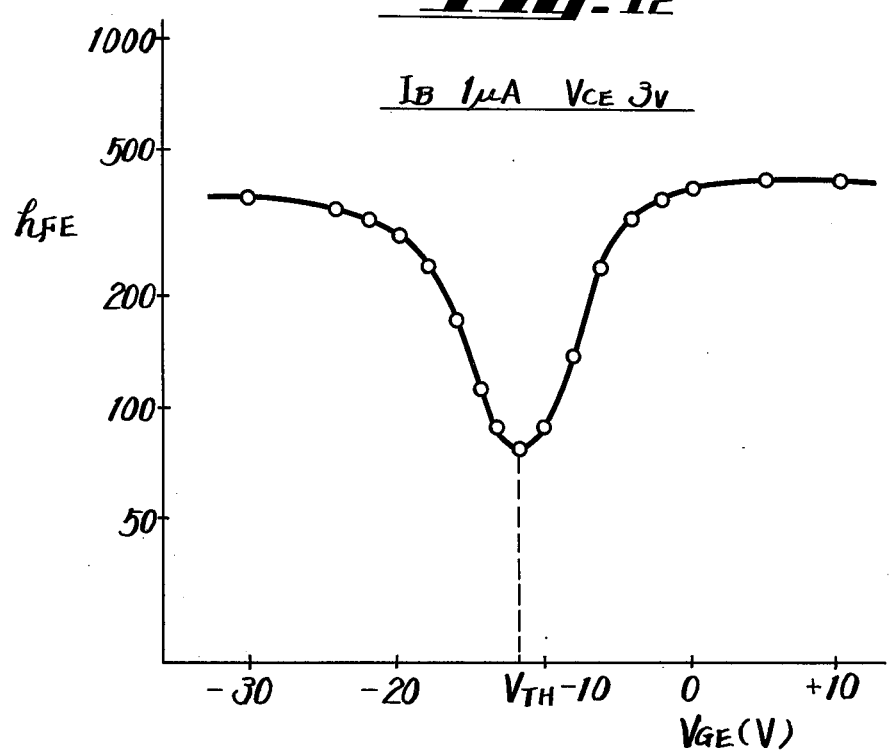
FIG. 12 is a graph used for explaining the transistor of FIG. 10.

FIG. 12 is the $h_{FE} - V_{GE}$ characteristic curve at the base current $I_B = 1\mu A$ and the collector-emitter voltage $V_{CE} = 3V$. In this case, the threshold voltage $V_{TH}$ can be freely selected in accordance with the impurity concentration of a portion where the control region 7 is formed, the thickness of the insulating layer 5 and the dielectric constant. It is preferred that the additional electrode 4G be formed extending over the high impurity concentration region 1a of the emitter region 1.

Figure 13:
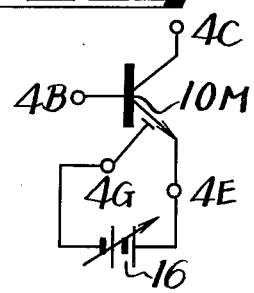
FIG. 13 is a connection diagram showing one example of the circuit of this invention using the transistor of FIG. 10.

FIG. 13 is one example of the circuit of this invention using the aforesaid MOS-type element, in which a variable DC voltage source 16 is connected between the additional electrode 4G and the first electrode or emitter electrode 4E in the MOS-type element 10M. In this circuit, if the voltage value of the voltage source 16 is varied, the potential $V_{GE}$ of the additional electrode 4G relative to the emitter region 1 can be changed and hence $h_{FE}$ of the element 10M can be controlled.

Further, the threshold voltage $V_{TH}$ is partially changed in the control region 7, or a plurality of control regions having different $V_{TH}$ or a plurality of additional electrodes 4G having different potentials are provided, thus the characteristics of FIG. 12 being made variable.

As described above, according to this invention, in a special 4-terminal type transistor, the value of the emitter-grounded current amplification factor $h_{FE}$ or the base-grounded current amplification factor $h_{FE}$ or the base-grounded current amplification factor $\alpha$ can be easily and freely controlled by changing a voltage supplied to one of its electrodes.

Figure 14:
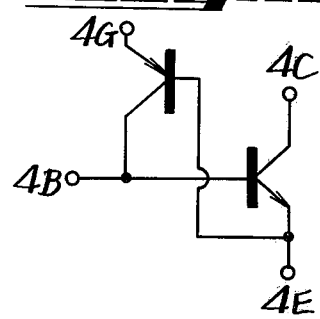
FIG. 14 is another equivalent circuit diagram for the specific transistor of FIG. 3.

The junction type element 10J of this invention can also be used in another manner. The potential of the additional region 6 is elevated from the base potential by increasing it over the PN-junction forward rising-up voltage $V_{BE}$ relative to the emitter region 1. Then, as shown in an equivalent circuit of FIG. 14, there is constructed a PNP transistor with the additional region 6 serving as the emitter, the first region 1 as the base and the second region 2 as the collector. The current amplification factor $\alpha$ of this PNP transistor is substantially 1. Accordingly, the PNP transistor becomes a current source for the base of the NPN transistor, and can serve as a constant current source or a variable current source with the potential of the additional electrode 4G being made constant or varied. This current source can also be used as a load of the prestage, so that a load resistance can be eliminated in an integrated circuit and is suitable particularly for use in a logic circuit.

Besides, in the PN-junction type or MOS-type element used in the circuit of this invention, the conductivity type of each region can be reversed to those shown in FIG. 3 or FIG. 10 to form a PNP-type element.

While the principles of the invention have been described above in connection with specific embodiments and particular modifications thereof, it is to be clearly understood that this description is made only by way of example and not as a limitation on the scope of the invention.

It will be apparent to those skilled in the art that many modifications and variations may be effected without departing from the spirit and scope of the novel concepts of the present invention.

We claim as our invention:

1. A semiconductor device adapted for providing controlled amplification, comprising:
   a. a first semiconductor region of given concentration and first conductivity type having a first electrode in contact therewith;
   b. a second semiconductor region of a second conductivity type opposite to said first type forming a first PN junction with said first region, said second region having a second electrode in contact therewith;
   c. a third semiconductor region of first conductivity type forming a second PN junction with said second region which is spaced from said first PN junction by said second region, said third region having a third electrode in contact therewith;
   d. a control semiconductor region of second conductivity type forming a third PN junction with said first region which is spaced from said first PN junction by said first region, said control region having a control electrode attached thereto;
   e. means connected to said first, second, and third electrodes for applying voltage potentials to said first, second, and third regions, and to forward bias said first PN junction to permit transporting of majority carriers in said first region to said third region;
   f. the distance between said first and third junctions being smaller than the diffusion length of the minority carriers in said first region, a current of minority carriers in said first region injected from said third junction being substantially equal to that from said first junction when no voltage potential is applied to said control electrode; and
   g. control voltage means connected to said control electrode for applying a voltage potential to said control region for changing said current of injected minority carriers from said third junction;
   whereby the current gain of the device is adjustable by the control voltage means.

2. The semiconductor device of claim 1 in which said first electrode contacts the first semiconductor region through a high concentration semiconductor region of first conductivity type and concentration higher than said given concentration, said high concentration region forming a low-high concentration junction with said first region spaced from said first PN junction by said first region, and the distance between said low-high junction and first PN junction being smaller than the diffusion length of the minority carriers in said first region.

3. The semiconductor device of claim 1 in which said means connected to said first, second, and third electrodes comprises an input circuit connected to said first and and second electrodes, and an output circuit connected to said first and third electrodes.

4. The semiconductor device of claim 1 in which said means connected to said first, second, and third electrodes comprises an input circuit connected to said first and second electrodes, and an output circuit connected to said second and third electrodes.

5. The semiconductor device of claim 1 in which said control voltage means comprises an impedance means connected between said control and first electrodes.

6. The semiconductor device of claim 5 in which said impedance means is controlled by a signal source.

7. The semiconductor device of claim 1 in which said first and third semiconductor regions have an impurity doping of approximately $10^{15}$ atoms/cm$^3$.

8. A semiconductor device adapted for providing controlled amplification, comprising:
   a. a first semiconductor region of given concentration and first conductivity type having a first electrode in contact therewith;
   b. a second semiconductor region of a second conductivity type opposite to said first type forming a first PN junction with said first region, said second region having a second electrode in contact therewith;
   c. a third semiconductor region of first conductivity type forming a second PN junction with said second region which is spaced from said first PN junction by said second region, said third region having a third electrode in contact therewith;
   d. an insulating layer on a surface of said first semiconductor region opposite said first PN junction and a control electrode on said insulating layer overlying said first semiconductor region to form a MOS element;
   e. means connected to said first, second, and third electrodes for applying voltage potentials to said first, second, and third regions, and to forward bias said first PN junction to permit transporting of majority carriers in said first region to said third region;
   f. variable control voltage means connected to said control electrode for inducing a control region in said first region adjacent said insulating layer and control electrode; and
   g. the distance between said insulating layer and first PN junction being smaller than the diffusion length of minority carriers in said first region;
   whereby the current gain of the device is adjustable by changing a potential of the voltage control means, said current gain having a relatively low value when said potential is at a threshold voltage and a relatively high value when said potential is to either side of the threshold voltage creating a depletion region or accumulation region in said control region.

9. The semiconductor device of claim 8 in which said control region comprises a depletion layer.

10. The semiconductor device of claim 8 in which said control region comprises an accumulation layer.

* * * * *